(12) United States Patent
Huai et al.

(10) Patent No.: US 9,419,210 B2
(45) Date of Patent: *Aug. 16, 2016

(54) SPIN-TRANSFER TORQUE MAGNETIC RANDOM ACCESS MEMORY WITH PERPENDICULAR MAGNETIC ANISOTROPY MULTILAYERS

(71) Applicant: Avalanche Technology, Inc., Fremont, CA (US)

(72) Inventors: Yiming Huai, Pleasanton, CA (US); Jing Zhang, Los Altos, CA (US); Rajiv Yadav Ranjan, San Jose, CA (US); Yuchen Zhou, San Jose, CA (US); Roger Klas Malmhall, San Jose, CA (US)

(73) Assignee: Avalanche Technology, Inc., Fremont, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/072,254

(22) Filed: Mar. 16, 2016

(65) Prior Publication Data

US 2016/0197269 A1 Jul. 7, 2016

Related U.S. Application Data

(63) Continuation of application No. 14/657,608, filed on Mar. 13, 2015, now Pat. No. 9,318,179, which is a continuation of application No. 13/225,338, filed on Sep. 2, 2011, now Pat. No. 9,019,758.

(60) Provisional application No. 61/382,815, filed on Sep. 14, 2010.

(51) Int. Cl.
*G11C 16/00* (2006.01)
*H01L 43/10* (2006.01)

(Continued)

(52) U.S. Cl.
CPC .............. *H01L 43/10* (2013.01); *G11C 11/161* (2013.01); *H01L 43/02* (2013.01); *H01L 43/08* (2013.01)

(58) Field of Classification Search
None
See application file for complete search history.

(56) References Cited

U.S. PATENT DOCUMENTS

| 6,579,625 B1 | 6/2003 | Engel et al. |
| 7,098,495 B2 | 8/2006 | Sun et al. |

(Continued)

OTHER PUBLICATIONS

S. Ikeda, K Miura, H. Yamamoto, K. Mizunuma, H.D. Gan, M. Endo, S. Kanai, J. Hayakawa, F. Matsukura, and H. Ohno, "A perpendicular-anisotropy CoFeB-MgO magnetic tunnel junction," Nature Materials, pp. 1-4, Jul. 11, 2010.

*Primary Examiner* — Kretelia Graham
(74) *Attorney, Agent, or Firm* — Bing K. Yen

(57) ABSTRACT

The present invention is directed to a spin transfer torque magnetic random access memory (STTMRAM) element comprising a composite free layer including one or more stacks of a bilayer unit that comprises an insulator layer and a magnetic layer with the magnetic layer having a variable magnetization direction substantially perpendicular to a layer plane thereof; a magnetic pinned layer having a first fixed magnetization direction substantially perpendicular to a layer plane thereof; a tunnel barrier layer formed between the composite free layer and the magnetic pinned layer; and a magnetic fixed layer coupled to the magnetic pinned layer through an anti-ferromagnetic coupling layer. The magnetic fixed layer has a second fixed magnetization direction that is substantially perpendicular to a layer plane thereof and is substantially opposite to the first fixed magnetization direction.

20 Claims, 7 Drawing Sheets

(51) Int. Cl.
*H01L 43/08* (2006.01)
*H01L 43/02* (2006.01)
*G11C 11/16* (2006.01)

(56) References Cited

U.S. PATENT DOCUMENTS

| 8,208,289 | B2 | 6/2012 | Kajiyama |
| 8,213,220 | B2 | 7/2012 | Wang et al. |
| 8,259,420 | B2 | 9/2012 | Zhao et al. |
| 9,318,179 | B2 * | 4/2016 | Huai ............... G11C 11/15 |
| 2007/0086121 | A1 | 4/2007 | Nagase et al. |
| 2007/0183187 | A1 | 8/2007 | Guo |
| 2010/0096716 | A1 | 4/2010 | Ranjan et al. |
| 2010/0277971 | A1 | 11/2010 | Slaughter et al. |
| 2011/0170341 | A1 | 7/2011 | Butler |
| 2012/0012953 | A1 | 1/2012 | Lottis et al. |
| 2012/0146167 | A1 | 6/2012 | Huai et al. |

* cited by examiner

SPIN-TRANSFER TORQUE MAGNETIC RANDOM ACCESS MEMORY WITH PERPENDICULAR MAGNETIC ANISOTROPY MULTILAYERS

CROSS REFERENCE TO RELATED APPLICATIONS

The present application is a continuation of the commonly assigned application bearing Ser. No. 14/657,608 filed on Mar. 13, 2015, entitled SPIN-TRANSFER TORQUE MAGNETIC RANDOM ACCESS MEMORY WITH PERPENDICULAR MAGNETIC ANISOTROPY MULTILAYERS," which is a continuation of the commonly assigned application bearing Ser. No. 13/225,338 filed on Sep. 2, 2011, entitled "SPIN-TRANSFER TORQUE MAGNETIC RANDOM ACCESS MEMORY WITH PERPENDICULAR MAGNETIC ANISOTROPY MULTILAYERS," which claims priority to a previously-filed U.S. provisional application, U.S. Application No. 61/382,815, entitled "SPIN-TRANSFER TORQUE MAGNETIC RANDOM ACCESS MEMORY WITH PERPENDICULAR MAGNETIC ANISOTROPY MULTILAYERS", filed on Sep. 14, 2010.

BACKGROUND OF THE INVENTION

1. Field of the Invention

The present invention relates to a spin-transfer torque (STT) magnetic random access memory (MRAM), and, more particularly, to an STTMRAM element having magnetic tunnel junctions (MTJs) with ferromagnetic multilayers whose magnetization is oriented perpendicular to the plane of the substrate, and having lower programming current density while maintaining higher thermal stability.

2. Description of the Prior Art

Magnetic random access memory (MRAM) is a type of non-volatile memory in which magnetization of magnetic layers in MTJs switches between parallel (corresponding to a low resistance state) and anti-parallel (corresponding to a high resistance state) configurations. One type of MRAM is spin-transfer torque magnetic random access memory (STT-MRAM) where switching occurs through the application of spin polarized current across the MTJ during programming.

STTMRAM has significant advantages over magnetic-field-switched (toggle) MRAM, which has been recently commercialized. The main hurdles associated with field-switched MRAM are its more complex cell architecture with high write current (currently in the order of milliamps (mA)) and poor scalability attributed to the process used to manufacture these devices. That is, these devices cannot scale beyond 65 nanometer (nm) process node. The poor scalability of such devices is intrinsic to the field writing methods. The current generated fields to write the bits increase rapidly as the size of the MTJ elements shrinks. STT writing technology allows directly passing a current through the MTJ, thereby overcoming the foregoing hurdles and resulting in much lower switching current (in the order of microamps (uA)), simpler cell architecture which results in a smaller cell size (for single-bit cells), reduced manufacturing cost, and more importantly, improved scalability.

One of the challenges for implementing STT is a substantial reduction of the intrinsic current density to switch the magnetization of the free layer while maintaining high thermal stability, which is required for long-term data retention. Minimal switching (write) current is required mainly for reducing the size of select transistor of the memory cell, which is typically coupled in series with MTJ, because the channel width of the transistor is proportional to the drive current of the transistor. It is understood that the smaller the STT current, the smaller the transistor size, leading to a smaller memory cell size. A smaller current also leads to smaller voltage across MTJ, which decreases the probability of tunneling barrier degradation and breakdown, ensuring a high write endurance of the MTJ cell. This is particularly important for STTMRAM, because both sense and write currents are driven through MTJ cells.

One of the efficient ways to reduce the programming current in STTMRAM is to use an MTJ with perpendicular anisotropy. Incorporation of conventional perpendicular anisotropy materials, such as FePt, into STTMRAM causes a high damping constant, leading to undesirably high switching current density. Furthermore, during manufacturing, conventional higher ordering transformation temperature required for forming L10 order structure could degrade the tunneling magneto-resistance (TMR) performance and make MTJ deposition process more demanding and complicated (such as elevated substrate temperatures during MTJ film deposition).

Prior art techniques rely on intrinsic perpendicular anisotropy of the Fe-rich CoFeB alloys, and on the anisotropy from the interface with the main MgO barrier. Having a single magnetic layer is limiting however. The layer has to be not too thin. Otherwise, it will become super-paramagnetic. It cannot be too thick either. Otherwise, it will become a layer with in-plane anisotropy. In this small parameter space, one has to make the coercive fields for the pinned and free layers as far apart as possible. Low thermal stability (>40 required) is also an issue and it may be necessary to increase this parameter to 50-60 for a reliable memory product. Thermal stability is defined by $KuV/k_BT$, where Ku represents magnetic anisotropy constant, V represents the volume of the free layer, $k_B$ is Boltzmann's constant and T represents temperature.

Thus there is a need to scale the perpendicular anisotropy of the free layer according to its effective magnetic thickness.

There is also a need for an STTMRAM element having an MTJ with perpendicular magnetic anisotropy material(s) with a simple film manufacturing process and an optimal combination of saturation magnetization (Ms) and anisotropy constant (Ku) to lower the damping constant and the magnetic anisotropy of the MTJ yielding a lower STT switching current density while maintaining high thermal stability and high TMR performance.

SUMMARY OF THE INVENTION

To overcome the limitations in the prior art described above, and to overcome other limitations that will become apparent upon reading and understanding the present specification, the present invention discloses a method and a corresponding structure for a magnetic memory device that is based on current-induced-magnetization-switching having reduced switching current in the magnetic memory.

Briefly, an embodiment of the present invention includes a spin-transfer torque magnetic random access memory (STT-MRAM) element that has a pinned layer having a first magnetization that is substantially fixed in one direction and formed on top of a substrate, and a tunnel barrier layer formed upon the pinned layer, and a composite free layer having a second magnetization that is switchable in two directions and formed upon the tunnel barrier layer. The composite free and pinned layers are made of multilayers with magnetic layers alternating with nonmagnetic insulating layers, such as aluminum nitride (AlN) and magnesium oxide (MgO). The magnetization direction of each of the composite free layer and pinned layer being substantially perpendicular to the plane of the substrate. During a write operation, a bidirectional electric current is applied across the STTMRAM element switching the second magnetization between parallel and anti-parallel states relative to the first magnetization. In some embodiments, the thermal stability of the STTMRAM is 50-60, making for a reliable memory product.

These and other objects and advantages of the present invention will no doubt become apparent after having read the following detailed description of the various embodiments illustrated in the several figures of the drawing.

IN THE DRAWINGS

DETAILED DESCRIPTION OF THE PREFERRED EMBODIMENTS

Figure 1:
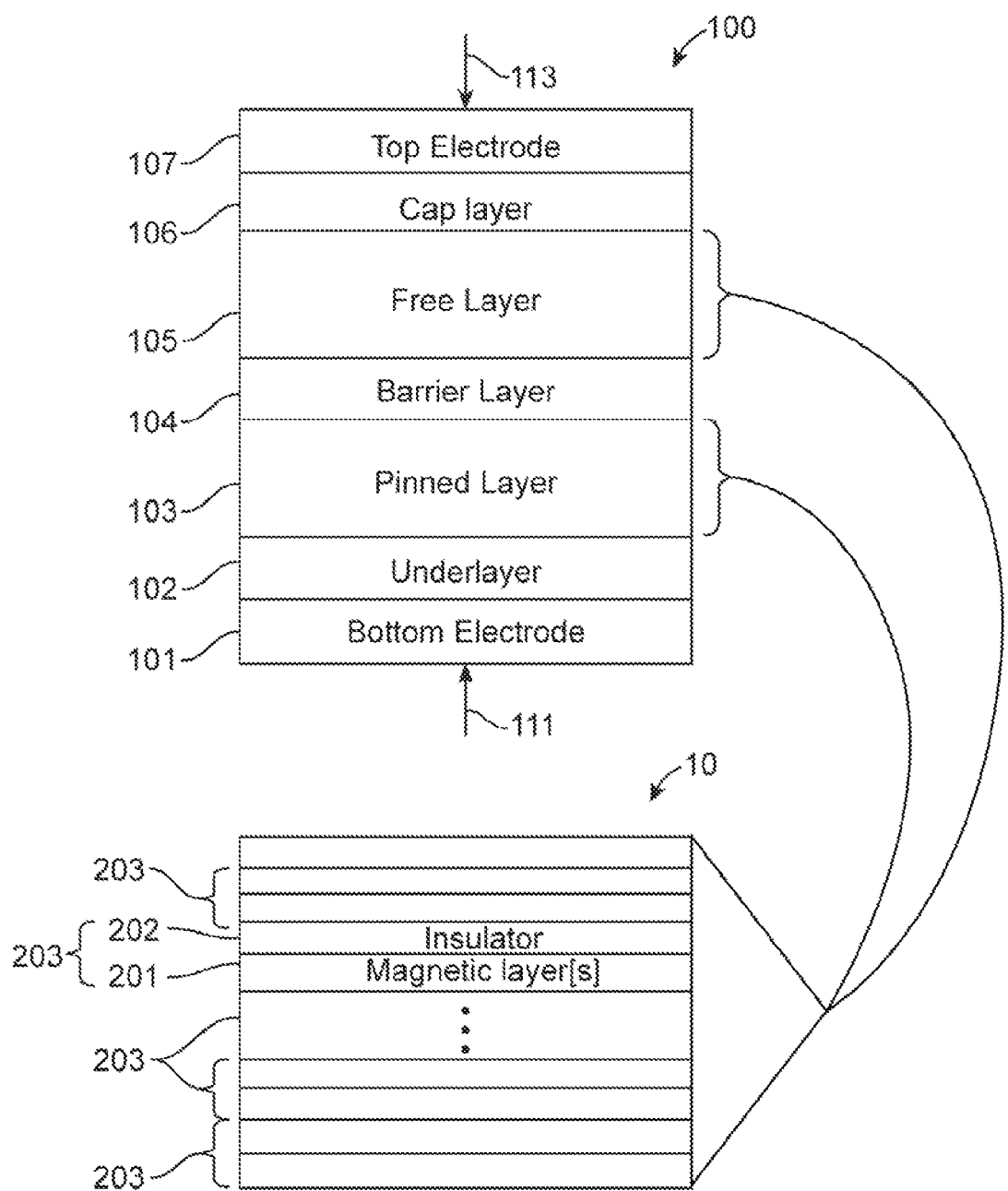
FIG. 1 shows the relevant layers of STTMRAM element 100, in accordance with an embodiment of the present invention.

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

In accordance with an embodiment of the present invention, a spin-transfer torque magnetic random access memory (STTMRAM) element includes a magnetic tunnel junction (MTJ) having a pinned layer and a free layer wherein the magnetic orientation of pinned layer and free layer is substantially perpendicular to the plane of the layers. The selection of the magnetic multilayers for use in each of the pinned layer and the free layer, as disclosed herein, advantageously reduces the switching current density, and increases reliability in single domain switching. In an exemplary embodiment, the switching current density is less than 1 mega amp per centimeter squared ($MA/cm^2$) while maintaining high thermal stability. Thermal stability is defined by $KuV/k_BT$. Ku represents magnetic anisotropy constant, V represents the volume of the free layer, $k_B$ is Boltzmann's constant and T represents temperature. In an exemplary embodiment, high thermal stability is greater than 40.

In one embodiment, the pinned layer and the free layer each is made of multilayers with the multilayers being made of a different number of repeated layers or repeated combination of layers. In some embodiments, the repeated layer is a bilayer made of a combination of a nonmagnetic insulator layer (A) and a magnetic layer (B). (A) or 'A' can be made of one or more nonmagnetic insulating material from the class of oxides, such as magnesium oxide (MgO), aluminum oxide ($Al_2O_3$), zinc oxide (ZnO), titanium oxide ($TiO_2$), strontium oxide (SrO), ruthenium oxide (RuO), silicon oxide ($SiO_2$), zirconium oxide ($ZrO_2$), hafnium oxide ($HfO_2$), tantalum oxide (TaO); and nitrides, such as aluminum nitride (AlN), titanium nitride (TiN), tantalum nitride (TaN), silicon nitride (SiN), zirconium nitride (ZrN), or mixed of oxide and nitrides, such as but not limited to aluminum oxide nitride (AlON) and other suitable oxide and/or nitride mixes. Layer (B), or 'B', can be any of the following magnetic materials: iron (Fe), iron-rich cobalt iron (CoFe) alloys, iron-rich nickel iron (NiFe) alloys, iron-rich CoFeNiB, iron-rich cobalt iron boron (CoFeB) alloys, iron-rich nickel iron boron (NiFeB) alloys, iron-rich iron oxide (FeOx), CoFeOx. Layer B can also in itself be a magnetic multilayer that contains a thin boron (B) absorption nonmagnetic metal layer, which in some embodiments may be between 0.3 to 1.0 nano meters (nm).

This absorption nonmagnetic metal layer can make multilayer perpendicular anisotropy more thermally stable and helps produce higher effective perpendicular anisotropy in the magnetic layer with promoting interface anisotropy effect between layer A and layer B, in particular, during thermal treatment. Material of this thin (boron) absorption layer can be a single element layer, such as Ta, Ti, Ru, and can also be a composite material composed of one or more of the following materials: Ta, Ti, Ru, in addition to one or more of the following materials: B, Co, Fe, Ni.

Referring now to FIG. 1, the relevant layers of an STTMRAM element 100 are shown, in accordance with an embodiment of the present invention. STTMRAM element 100 is shown to comprise: bottom electrode (BE) 101, underlayer(s) 102, pinned layer (or "fixed layer") 103, tunnel (or "barrier" or "tunnel barrier") layer 104, free layer (or "composite free layer") 105, cap layer 106 and top electrode (TE) 107 with each of the pinned layer 103 and/or the free layer 105 comprising a multilayer 10. An exploded view of the multilayer 10 is shown under the STTMRAM element 100. It is understood that the layer 103 and the layer 105 are each made of the multilayer 10.

As with other embodiments shown in subsequent figures herein, a bidirectional electrical current is applied either at 111 or at 113 to the element 100, during operation thereof, causing the layer 105 to switch its magnetization from parallel to anti-parallel or vice versa relative to that of the layer 103 to store a bit of information (or a logical state) in the element 100.

The BE 101 is typically formed on top of the substrate (not shown in FIG. 1) or on top of the metal layer such as Cu or tungsten (W), in case of a CMOS starting wafer. The underlayer 102, which in one embodiment is multi-layered and in another embodiment is a single layer, is formed on top of the BE 101. The pinned layer 103 is formed on top of the underlayer 102. The tunnel barrier layer 104 is formed on top of the pinned layer 103. The free layer 105 is formed on top of the tunnel layer 104. The cap layer 106 is formed on top of the free layer 105 and the TE 107 is formed on top of the cap layer 106.

The pinned layer 103 and the free layer 105 each comprises a composite multilayer structure with multiple repeats of a basic bilayer unit 203 shown by the multilayer 10 of FIG. 1. The multilayer 10 is shown made of a magnetic layer 201 and a nonmagnetic insulating layer 202, described hereinabove as nonmagnetic insulator layer (A) and a magnetic layer (B), respectively. This basic bilayer unit 203 is designed so as to enhance the perpendicular anisotropy in the magnetic layer 201. This enables the magnetic moment in the layer 201 to have a preferred orientation that is perpendicular to the layer plane. The magnetic layers, in close contact with the tunnel barrier layer 104, can be of different materials than in other magnetic layer repeats.

The perpendicular anisotropy comes about by a combination of chemical composition and interface effects. In the embodiment of FIG. 1, iron-rich materials are used in combination with an insulating material, such as MgO. This is known to lead to perpendicular anisotropy in a single magnetic layer. However, the parameter space for desirable characteristics is limited in the case of a single layer. One has to make the magnetic layer thin enough (typically below 3 nm) so that interface anisotropy energy is enough to bring the magnetization to an out-of-plane preferred direction. An iron-rich CoFeB alloy magnetic layer has perpendicular anisotropy when it is typically below 1.3 nm in thickness. Making this magnetic layer too thin poses problems with the layer becoming superparamagnetic (thermally unstable) or even nonmagnetic at room temperature. The pinned layer 103 and the free layer need to have different coercive fields, where coercive field refers to as the magnetic field applied to change the orientation of magnetization from one direction to the other direction (related to the magnetic anisotropy), so that one switches its magnetization easier than the other, hence the names "pinned" and "free". For a single layer this is achieved by varying the thickness of the magnetic layer, but there is not a lot of room to improve because of limited thickness range. In addition, the thermal stability is proportional to the interface energy and having only one interface, or two at most, is limiting.

In the embodiment of FIG. 1, multiple interfaces and magnetic layers are repeated to make up for the limited useful thickness range in the single magnetic layer. In essence a multilayer approach is utilized to scale up the perpendicular anisotropy without the penalty of reduced effective magnetic thickness. The bilayer basic unit has the insulating layer thickness, in some embodiments, in the range of 0.3-3 nm and the ferromagnetic layer thickness, in some embodiments, is in the range of 0.3-6 nm. In the thinner insulating thickness range there can be pinholes in the insulating layer through which the ferromagnetic layers can be magnetically coupled. This makes the entire multilayer structure even more stable against thermal fluctuations of the magnetization direction. For thicker insulating layer, the magnetic layers are decoupled, so a thicker magnetic layer is generally preferred.

As previously noted, the layer 201 is magnetic layer and 202 is an insulator or "insulating" layer. The pair of layers 201 and 202 can also form a repeating structure, basic bilayer unit 203 that repeats in a thickness (or vertical) direction to form a multi-layer structure. In some embodiments, the multilayer structure advantageously ends with one of the magnetic layers 201 being adjacent and in direct contact with the barrier layer 104 of an element 100. The basic bilayer unit 203 can be repeated an integer, 'n', number of times with n being one or greater.

Figure 1A:
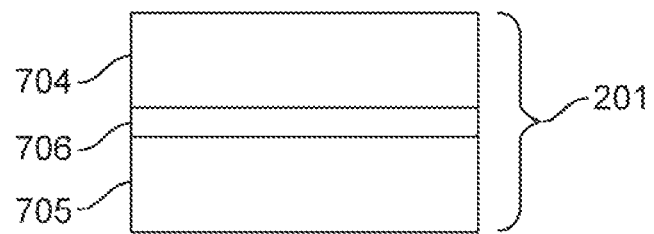
FIG. 1A shows further details of one of the layers of the element 100, in accordance with an embodiment of the present invention.

FIG. 1A shows further details of the layer 201, in accordance with another embodiment of the invention. The layer 201 is shown to include a magnetic layer 704 and a magnetic layer 705 separated by a non-magnetic boron absorption layer 706, where 704 and 705 may or may not be identical in composition depending on the effective perpendicular anisotropy and the effective magnetic moment optimization requirement for layer 201. All these iron-rich alloys contain more than 50% iron in atomic percentage. These alloys may be doped with a small atomic percentage (typically below 15 at. %) of other nonmagnetic elements, Z and Y, in order to obtain the desired Ku (anisotropy constant) and Ms (saturation magnetization) combination for reducing the damping constant, magnetization (Ms), and for reducing the distribution of perpendicular magnetic anisotropy. Z can be one or more of these materials: boron (B), phosphorous (P), carbon (C), nitrogen (N) and Y represents any of the materials: tantalum (Ta), titanium (Ti), niobium (Nb), zirconium (Zr), tungsten (W), silicon (Si), copper (Cu), silver (Ag), aluminum (Al), chromium (Cr), tin (Sn), lead (Pb), antimony (Sb), hafnium (Hf), bismuth (Bi), molybdenum (Mo), or rhodium (Rh). In addition, the magnetic layer B can also be comprised of multi-layer of magnetic materials such as described above.

In another embodiment of the invention, the magnetic layer 201 that is adjacent to the barrier layer 104 is made of CoFe and CoFeB alloy having greater than 50 at. % of Fe, or Fe—ZY alloy having less than 15 at. % of Z, where Z is one or more of the following materials: boron (B), phosphorous (P), carbon (C), nitrogen (N) and Y represents any of the materials: tantalum (Ta), titanium (Ti), niobium (Nb), zirconium (Zr), tungsten (W), silicon (Si), copper (Cu), silver (Ag), aluminum (Al), chromium (Cr), tin (Sn), lead (Pb), antimony (Sb), hafnium (Hf), bismuth (Bi), molybdenum (Mo), or rhodium (Rh).

All these iron-rich alloys contain more than 50% iron in atomic percentage. These alloys may be doped with a small atomic percentage (typically below 15 at. %) of other nonmagnetic elements, Z and Y, in order to obtain the desired Ku (anisotropy constant) and Ms (saturation magnetization) combination for reducing the damping constant, magnetization (Ms), and therefore for reducing the distribution of perpendicular magnetic anisotropy. Z can be one or more of these materials: boron (B), phosphorous (P), carbon (C), nitrogen (N) and Y represents any of the materials: tantalum (Ta), titanium (Ti), niobium (Nb), zirconium (Zr), tungsten (W), silicon (Si), copper (Cu), silver (Ag), aluminum (Al), chromium (Cr), tin (Sn), lead (Pb), antimony (Sb), hafnium (Hf), bismuth (Bi), molybdenum (Mo) or rhodium (Rh). In addition, the magnetic layer B can also be comprised of multi-layer of magnetic materials such as described above. In a preferred mode, the magnetic layer adjacent to the "barrier" layer is comprised of CoFe and CoFeB alloy having greater than 50 at. % of Fe, or Fe—ZY alloy having less than 15 at. % of Z and Y, where Z is one or more of the following materials: boron (B), phosphorous (P), carbon (C), nitrogen (N) and Y represents any of the materials: tantalum (Ta), titanium (Ti), niobium (Nb), zirconium (Zr), tungsten (W), silicon (Si), copper (Cu), silver (Ag), aluminum (Al), chromium (Cr), tin (Sn), lead (Pb), antimony (Sb), hafnium (Hf), bismuth (Bi), molybdenum (Mo), or rhodium (Rh).

The damping constant and the magnetic perpendicular anisotropy of the pinned layer are designed to be much larger than that of the free layer. This can be realized with a larger number of repeats of the basic unit used in the pinned layer, leading to an increased perpendicular anisotropy and coercive field.

As previously stated, the layer 706, in some embodiments, is a single element layer, and made of material, such as Ta, Ti, Ru, and in other embodiments, it is made of a composite material from one or more of the following: Ta, Ti, Ru, in addition to one or more of the following materials: B, Co, Fe, Ni.

Figure 2:
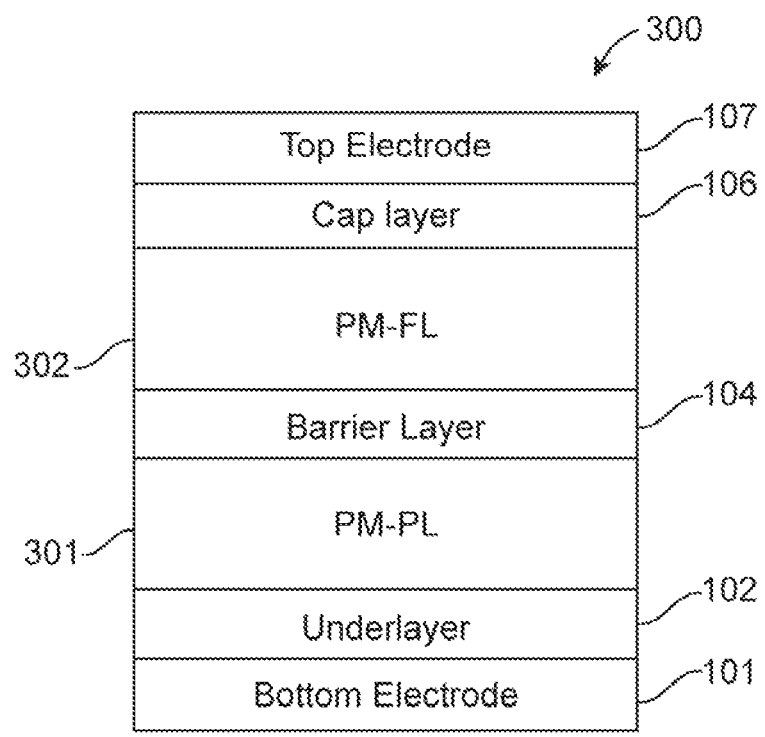
FIG. 2 shows the relevant layers of STTMRAM element 300, in accordance with another embodiment of the present invention.

FIG. 2 shows an STTMRAM element 300, in accordance with another embodiment of the invention. The element 300 is shown to include the BE 101, the underlayer 102, a perpendicular magnetization pinned layer (PM-PL) 301, a barrier layer 104, a perpendicular magnetization free layer (PM-FL) 302, the cap layer 106, and the TE 107. Each of the layers 301 and 302 is made of perpendicular anisotropy multilayer structures as described in FIG. 1. The layer 301 has a larger number of repeats of the multilayer structure (multilayer 10) to enhance its coercive field and make its magnetization direction very stable. The free layer 105 of the element 100 typically has a fewer number of repeated bilayer units than the layer 302 to enable easier switching with an electric current that is polarized by the stable pinned layer. The free layer 105 however, has a suitable number of repeated bilayer units to make it stable against thermal fluctuations that might cause its magnetization to flip. The capping layer 106 can enhance the perpendicular anisotropy of the free layer PM-FL 302 and can be any of the materials: Mn containing alloys such as PtMn, NiMn, IrMn, FeMn, or Ru or Ta. The term "PM", as used herein, is an acronym for "perpendicular multilayer". The term "PL", as used herein, is an acronym for "pinned layer".

Figure 3:
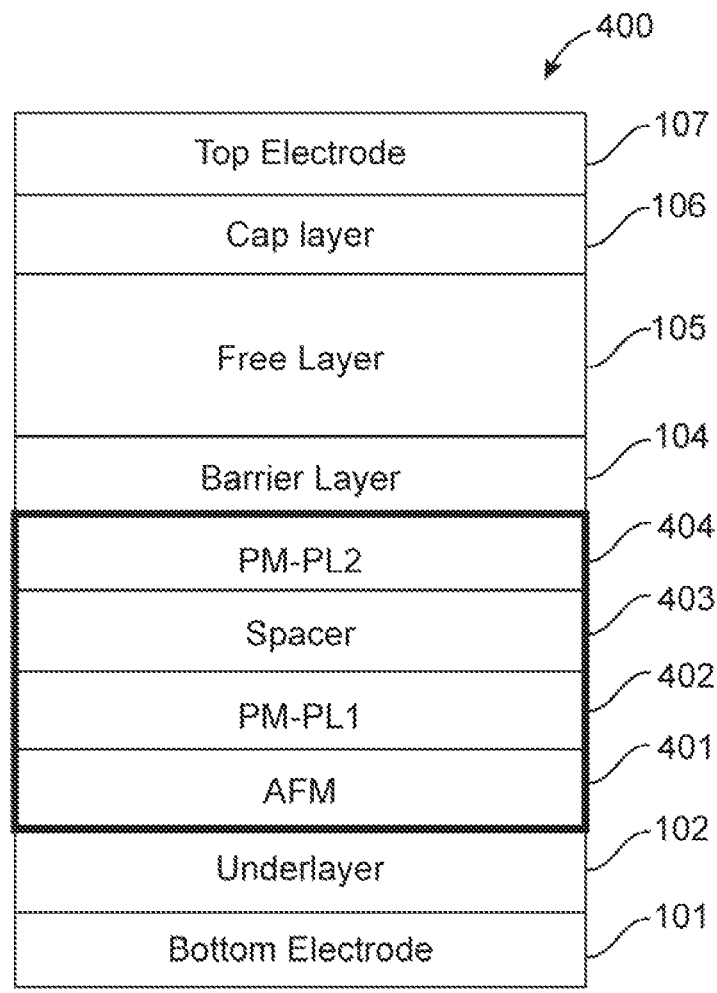
FIG. 3 shows the layers of STTMRAM element 400, in accordance with another embodiment of the present invention.

FIG. 3 shows an STTMRAM element 400, in accordance with another embodiment of the invention. The STTMRAM element 400 is analogous to the element 100 except that it has a multi-layered pinned layer, formed between the underlayer 102 and the barrier layer 104. Namely, the multilayer structure of the pinned layer of the element 400 includes a perpendicular magnetic pinned layer (PM-PL) (also referred to herein as "composite magnetic layer") 402 formed on top of the underlayer 102, a spacer layer 403, formed on top of the layer 402, and a PM-PL 404, formed on top of the layer 403. Optionally, an anti-ferromagnetic layer (AFM) 401 is shown formed on top of the layer 102 and below the PM-PL 402. Accordingly, the pinned layer of the STTMRAM element 400 is made up of the PM-PL 402, the layer 403, and the PM-PL 404 (also referred to herein as "composite magnetic layer").

In some embodiments, the spacer layer 403 is non-magnetic and made of Ru and acts to make the magnetization directions of the PM-PL 402 and PM-PL 404 anti-parallel relative to each other. The PM-PL 402 and PM-PL 404, each has either the multilayer 10 shown in FIG. 1, or other embodiments described herein.

In those embodiments using the AFM 401, the pinned layer of the element 400 includes the AFM 401. In these embodiments, the AFM 401 is used to pin strongly the magnetization of the layer PM-PL 402 in a given direction, thus making the pinned layer of the element 400, in FIG. 3, harder to switch.

The PM-PL 404 and PM-PL 402 of the element 400, being coupled to each other in an anti-parallel direction relative to each other through a thin nonmagnetic conducting spacer layer (such as Ru), i.e. layer 403, has the effect of reducing the magnetic dipolar stray field acting on the free layer 105. This is important for controlling symmetrical write currents (making the write current $I^{ap-p}$ value from antiparallel resistance state to parallel state closely equal to that of the write current $I^{a-ap}$ from parallel resistance state to antiparallel state) in a memory device, such as the STTMRAM elements of the various embodiments of the invention.

Figure 4:
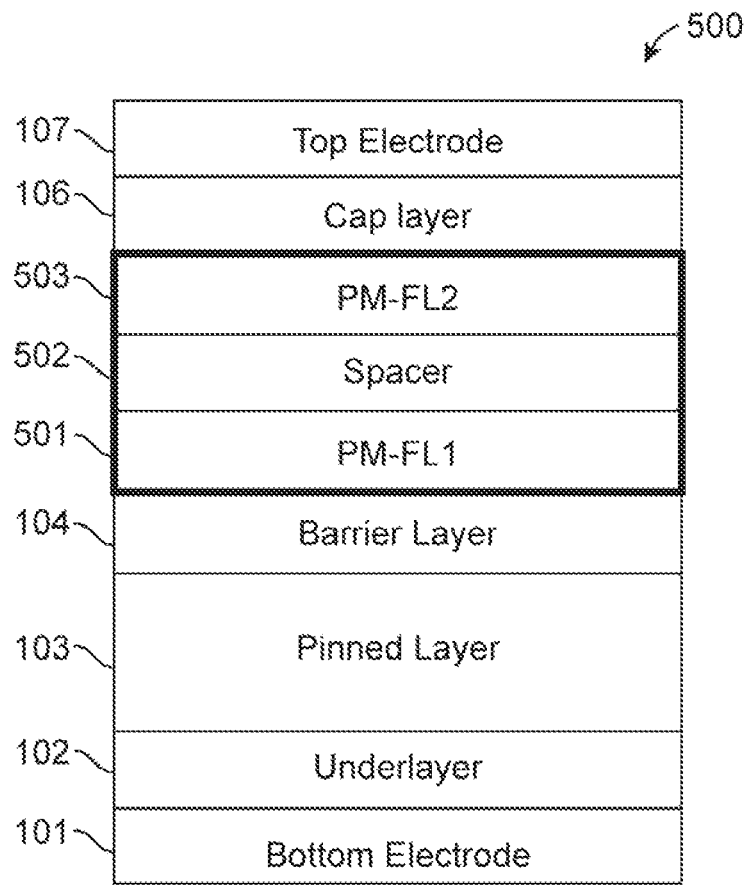
FIG. 4 shows the relevant layers of STTMRAM element 500, in accordance with another embodiment of the present invention.

FIG. 4 shows an STTMRAM element 500, in accordance with yet another embodiment of the invention. The element 500 is analogous to the element 100 except that its free layer is made of multiple layers. That is, the free layer of the element 500 is formed of the perpendicular magnetic free layer (PM-FL) (also referred to herein as "composite magnetic layer") 501, the spacer layer 502, and the PM-FL (also referred to herein as "composite magnetic layer") 503 with the PM-FL 501 being formed on top of the barrier layer 104, the spacer layer 502 being formed on top of the PM-FL 501, and the PM-FL 503 being formed on top of the layer 502. The cap layer 106 is formed on top of the PM-FL 503. The free layer of the element 500 has a synthetic coupling structure.

The PM-FL 501 and the PM-FL 503, are each made of magnetic material, such as those listed hereinabove relative to the PM-FL 302 of the element 300, in some embodiments of the invention. The PM-FL1 501 and PM-FL2, 503 have the multilayer structure shown in FIG. 1 and subsequent embodiments described herein.

In some embodiments, the layer 502 is made of any of the material ruthenium (Ru), chromium (Cr), or magnesium oxide (MgO). The magnetizations in the PM-FL 501 and PM-FL 503, each have perpendicular anisotropy (preferred directions) and can be coupled either parallel or anti-parallel through the layer 502. This type of structure reduces the switching current while maintaining thermal stability.

Figure 5:
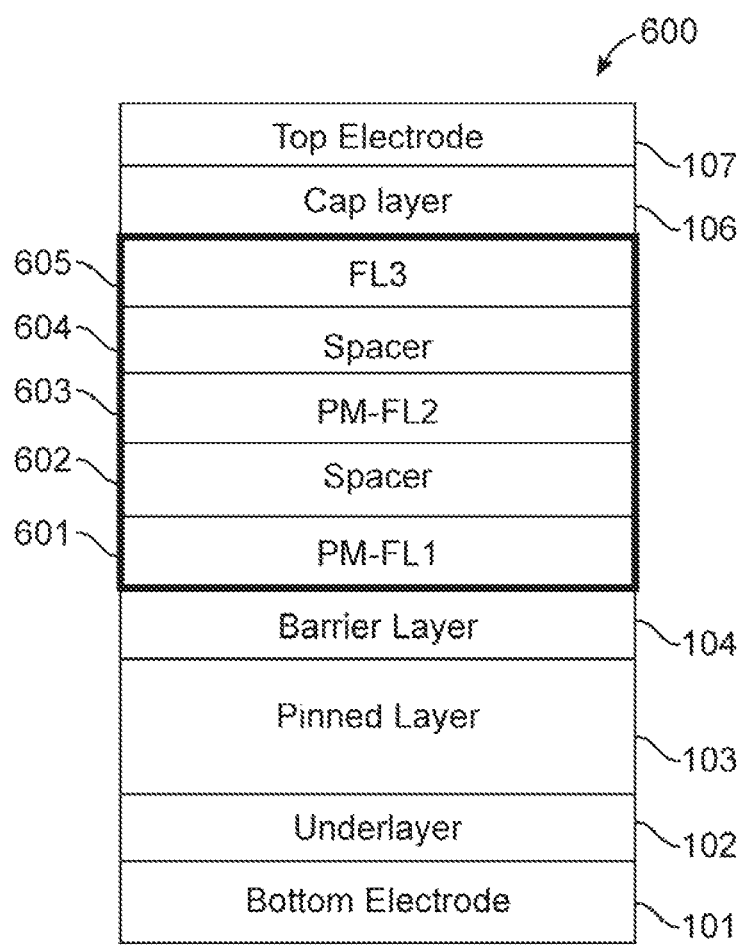
FIG. 5 shows the relevant layers of STTMRAM element 600, in accordance with another embodiment of the present invention.

FIG. 5 shows an STTMRAM element 600, in accordance with another embodiment of the invention. The element 600 is analogous to the element 500 except for its free layer, which includes additional layers. That is, the free layer of the element 600 includes an additional spacer layer 604 and a free sub-layer 605 as a part of its free layer, which offer an enhancement over previous embodiment herein of the free layer structure.

The free layer of the element 600 is shown to include a PM-FL 601, a spacer layer 602, formed on top of the PM-FL 601, a PM-FL 603, formed on top of the layer 602, the spacer layer 604, formed on top of the PM-FL 603, and the sub-layer 605, formed on top of the layer 604. The free layer has a perpendicular anisotropy and is formed on top of the barrier layer 104. The cap layer 106 is formed on top of the sub-layer 605.

In some embodiments, the layer 604 is made of non-magnetic material and the sub-layer 605 is made of magnetic material and has an in-plane anisotropy. As current passes through the STTMRAM element 600, the in-plane polarized electrons coming from the sub-layer 605 help switch the magnetization in the PM-FL 603.

In some embodiments, the PM-FL 601, the layer 602, and the PM-FL 603 are each made of corresponding layers of the element 500. The layer 604 is made of any of the materials: magnesium oxide (MgO), ruthenium (Ru) and Ta (tantalum). The sub-layer 605 is made of any of the following materials: CoFeB alloys, CoFe alloys, or CoFeB—X alloys, where X is any of the elements Ti, or Ni. It is noted that "FL" as used herein is an abbreviation of the term "free layer".

Figure 6:
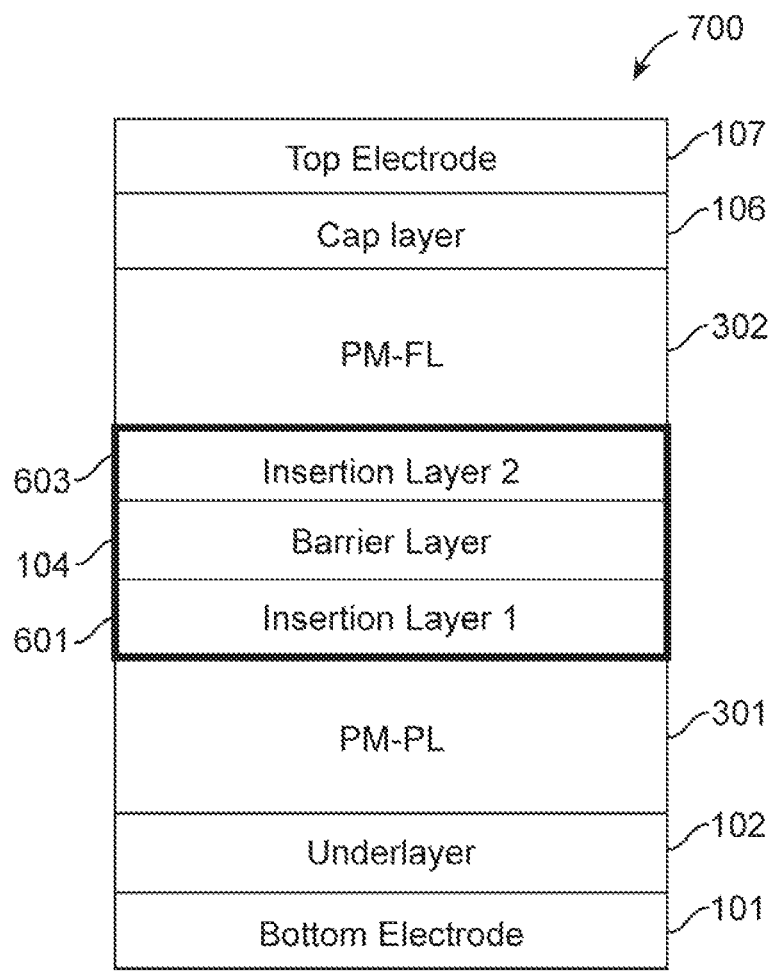
FIG. 6 shows the relevant layers of STTMRAM element 700, in accordance with another embodiment of the present invention.

FIG. 6 shows an STTMRAM element 700, in accordance with another embodiment of the invention. The element 700 is analogous to the element 300 except that it includes additional layers formed on top and bottom of the barrier layer 104. The element 700 is shown to include an insertion layer 601, formed on top of the PM-PL 301, on top of which is formed the barrier layer 104, and an insertion layer 603, formed on top of the barrier layer 104. The PM-FL 302 is shown formed on top of the insertion layer 603.

The insertion layers 601 and 603, alternatively, can be formed adjacent to the barrier layer of the other various embodiments shown and discussed herein to improve the tunnel magnetoresistance (TMR) of the STTMRAM element in which they are added and further, to reduce the switching current thereof, as experienced by the element 700. In element 700, the insertion layers 601 and 603 may be considered a part of the barrier layer of the element 700.

In some embodiment, the insertion layers 601 and 603 are each made of any of the following materials: Co, Fe, CoX1, FeX1 and CoFeX1, with optional materials X1 which can be boron, Ta, Ti, Hf, or Cr.

It is noted that the thickness of the lines shown in various figures of the embodiments, in addition to any of the sizes (widths) of the various layers shown in the figures of the various embodiments, in no way reflect actual sizes or represent thickness or are relevant to the various embodiments shown and described herein.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A spin transfer torque magnetic random access memory (STTMRAM) element comprising:
   a composite free layer including one or more stacks of a bilayer unit that comprises an insulator layer and a magnetic layer, said magnetic layer having a variable magnetization direction substantially perpendicular to a layer plane thereof,
   a magnetic pinned layer having a first fixed magnetization direction substantially perpendicular to a layer plane thereof;
   a non-magnetic tunnel barrier layer formed between said composite free layer and said magnetic pinned layer; and
   a magnetic fixed layer coupled to said magnetic pinned layer through an anti-ferromagnetic coupling layer, said magnetic fixed layer having a second fixed magnetization direction that is substantially perpendicular to a layer plane thereof and is substantially opposite to said first fixed magnetization direction.

2. The STTMRAM element of claim 1, wherein said anti-ferromagnetic coupling layer is made of ruthenium.

3. The STTMRAM element of claim 1, wherein said non-magnetic tunnel barrier is made of magnesium oxide.

4. The STTMRAM element of claim 1, wherein said insulator layer of said bilayer unit is made of a magnesium oxide compound, said magnetic layer of said bilayer unit comprises cobalt and iron.

5. The STTMRAM element of claim 1, wherein said insulator layer of said bilayer unit is made of an insulator material selected from the group consisting of aluminum oxide, zinc oxide, titanium oxide, strontium oxide, ruthenium oxide, silicon oxide, zirconium oxide, hafnium oxide, tantalum oxide, silicon nitride, and any combinations thereof.

6. The STTMRAM element of claim 1, wherein said magnetic layer of said bilayer unit further comprises first and second magnetic sublayers separated by a boron absorption layer, said first and second magnetic sublayers having said variable magnetization direction substantially perpendicular to layer planes thereof.

7. The STTMRAM element of claim 6, wherein said boron absorption layer is made of a material selected from the group consisting of Ta, Ti, Ru, and any combinations thereof.

8. The STTMRAM element of claim 6, wherein said boron absorption layer is made of a material selected from the group consisting of Ta, Ti, Ru, Co, Fe, Ni, and any combinations thereof.

9. The STTMRAM element of claim 6, wherein at least one of said first and second magnetic sublayers is made of a CoFeB or CoFe alloy.

10. The STTMRAM element of claim 1, wherein said magnetic pinned layer comprises iron and cobalt.

11. The STTMRAM element of claim 1, wherein said magnetic pinned layer further comprises first and second magnetic sublayers separated by a boron absorption layer, said first and second magnetic sublayers having said first fixed magnetization direction substantially perpendicular to layer planes thereof.

12. The STTMRAM element of claim 11, wherein said boron absorption layer is made of a material selected from the group consisting of Ta, Ti, Ru, and any combinations thereof.

13. The STTMRAM element of claim 11, wherein said boron absorption layer is made of a material selected from the group consisting of Ta, Ti, Ru, Co, Fe, Ni, and any combinations thereof.

14. The STTMRAM element of claim 11, wherein at least one of said first and second magnetic sublayers is made of a CoFeB or CoFe alloy.

15. The STTMRAM element of claim 1, further comprising a magnetic insertion layer formed between said composite free layer and said tunnel barrier layer.

16. The STTMRAM element of claim 15, wherein said magnetic insertion layer comprises iron.

17. The STTMRAM element of claim 15, wherein said magnetic insertion layer is made of a magnetic metal or alloy selected from the group consisting of Co, Fe, CoFe, B, Ta, Ti, Hf, Cr, and any combinations thereof.

18. The STTMRAM element of claim 1, further comprising a magnetic insertion layer formed between said magnetic pinned layer and said tunnel barrier layer.

19. The STTMRAM element of claim 18, wherein said magnetic insertion layer comprises iron.

20. The STTMRAM element of claim 18, wherein said magnetic insertion layer is made of a magnetic metal or alloy selected from the group consisting of Co, Fe, CoFe, B, Ta, Ti, Hf, Cr, and any combinations thereof.

* * * * *